United States Patent
Takeuchi et al.

(10) Patent No.: US 9,337,298 B2
(45) Date of Patent: May 10, 2016

(54) SILICON CARBIDE SEMICONDUCTOR DEVICE AND METHOD FOR PRODUCING THE SAME

(71) Applicants: DENSO CORPORATION, Kariya, Aichi-pref. (JP); Kazumi Chida, Toyota-shi, Aichi-ken (JP)

(72) Inventors: Yuichi Takeuchi, Obu (JP); Kazumi Chida, Nissin (JP); Narumasa Soejima, Seto (JP); Yukihiko Watanabe, Nagoya (JP)

(73) Assignees: DENSO CORPORATION, Kariya (JP); TOYOTA JIDOSHA KABUSHIKI KAISHA, Toyota-shi (JP)

(*) Notice: Subject to any disclaimer, the term of this patent is extended or adjusted under 35 U.S.C. 154(b) by 0 days.

(21) Appl. No.: 14/402,119
(22) PCT Filed: Jun. 6, 2013
(86) PCT No.: PCT/JP2013/003547
§ 371 (c)(1),
(2) Date: Nov. 19, 2014
(87) PCT Pub. No.: WO2013/187019
PCT Pub. Date: Dec. 19, 2013

(65) Prior Publication Data
US 2015/0129895 A1 May 14, 2015

(30) Foreign Application Priority Data
Jun. 14, 2012 (JP) .................... 2012-134917

(51) Int. Cl.
*H01L 29/66* (2006.01)
*H01L 29/423* (2006.01)
(Continued)

(52) U.S. Cl.
CPC ........ *H01L 29/66068* (2013.01); *H01L 21/049* (2013.01); *H01L 21/0455* (2013.01);
(Continued)

(58) Field of Classification Search
CPC ............ H01L 29/6608; H01L 29/7827; H01L 29/7811; H01L 29/7813; H01L 29/0623; H01L 29/4236; H01L 29/1608; H01L 29/7397
See application file for complete search history.

(56) References Cited

U.S. PATENT DOCUMENTS

| 6,342,709 B1 | 1/2002 | Sugawara et al. |
| 2005/0233539 A1 | 10/2005 | Takeuchi et al. |

(Continued)

FOREIGN PATENT DOCUMENTS

| JP | H11-233391 A | 8/1999 |
| JP | 2001-267570 A | 9/2001 |

(Continued)

OTHER PUBLICATIONS

International Search Report and Written Opinion of the International Searching Authority mailed Aug. 27, 2013 for the corresponding international application No. PCT/JP2013/003547 (and English translation).

(Continued)

*Primary Examiner* — Thanhha Pham
(74) *Attorney, Agent, or Firm* — Posz Law Group, PLC

(57) ABSTRACT

In a method for producing an SiC semiconductor device, a p type layer is formed in a trench by epitaxially growing, and is then left only on a bottom portion and ends of the trench by hydrogen etching, thereby to form a p type SiC layer. Thus, the p type SiC layer can be formed without depending on diagonal ion implantation. Since it is not necessary to separately perform the diagonal ion implantation, it is less likely that a production process will be complicated due to transferring into an ion implantation apparatus, and thus manufacturing costs reduce. Since there is no damage due to a defect caused by the ion implantation, it is possible to reduce a drain leakage and to reliably restrict the p type SiC layer from remaining on the side surface of the trench.

6 Claims, 9 Drawing Sheets

(51) Int. Cl.
  *H01L 29/739* (2006.01)
  *H01L 29/78* (2006.01)
  *H01L 29/06* (2006.01)
  *H01L 21/04* (2006.01)
  *H01L 29/16* (2006.01)
  *H01L 21/3065* (2006.01)
  *H01L 29/04* (2006.01)
  *H01L 29/10* (2006.01)

(52) U.S. Cl.
  CPC ........ *H01L21/3065* (2013.01); *H01L 29/0623* (2013.01); *H01L 29/1608* (2013.01); *H01L 29/4236* (2013.01); *H01L 29/7397* (2013.01); *H01L 29/7811* (2013.01); *H01L 29/7813* (2013.01); *H01L 29/7827* (2013.01); *H01L 29/045* (2013.01); *H01L 29/0619* (2013.01); *H01L 29/0661* (2013.01); *H01L 29/0696* (2013.01); *H01L 29/1095* (2013.01)

(56) References Cited

U.S. PATENT DOCUMENTS

| | | |
|---|---|---|
| 2006/0289928 A1 | 12/2006 | Takaya et al. |
| 2007/0015333 A1 | 1/2007 | Kishimoto et al. |
| 2008/0038890 A1 | 2/2008 | Tucker |
| 2009/0114923 A1 | 5/2009 | Iwamuro |
| 2009/0289264 A1 | 11/2009 | Matsuki et al. |
| 2010/0006861 A1 | 1/2010 | Yamamoto et al. |
| 2010/0019250 A1 | 1/2010 | Nakamura et al. |
| 2010/0224932 A1 | 9/2010 | Takaya et al. |
| 2011/0254010 A1* | 10/2011 | Zhang ................. H01L 29/0623 257/66 |
| 2012/0052642 A1 | 3/2012 | Endo et al. |
| 2015/0048382 A1 | 2/2015 | Takeuchi et al. |

FOREIGN PATENT DOCUMENTS

| | | |
|---|---|---|
| JP | 2003-031802 A | 1/2003 |
| JP | 2006-032420 A | 2/2006 |
| JP | 2009-081412 A | 4/2009 |
| JP | 2012-4312 A | 1/2012 |

OTHER PUBLICATIONS

Office Action issued Nov. 10, 2015 in the corresponding KR application No. 10-2014-7034621 (with English translation).
Extended European Search Report issued Feb. 10, 2016 in corresponding EP application No. 13804396.3.
U.S. Appl. No. 15/001,726, Jan. 20, 2016, Takeuchi et al.
Office Action dated Jan. 29, 2016 issued in co-pending U.S. Appl. No. 14/387,425.

* cited by examiner

SILICON CARBIDE SEMICONDUCTOR DEVICE AND METHOD FOR PRODUCING THE SAME

CROSS REFERENCE TO RELATED APPLICATIONS

This application is a U.S. national stage application of PCT/JP2013/003547 filed on Jun. 6, 2013 and is based on Japanese Patent Application No. 2012-134917 filed on Jun. 14, 2012, the disclosure of which is incorporated herein by reference.

TECHNICAL FIELD

The present disclosure relates to a silicon carbide (hereinafter referred to as SiC) semiconductor device having a semiconductor switching element with a trench gate structure, and a method for producing the same.

BACKGROUND ART

In a semiconductor device having a semiconductor switching device, an increase in channel density is effective to allow a larger current to flow. In a silicon transistor, a MOSFET with a trench gate structure is employed so as to increase the channel density, and such a silicon transistor has been put into practice. Although the trench gate structure can be employed to an SiC semiconductor device, the SiC has a breakdown electric field intensity of ten times as high as that of silicon. Therefore, the SiC semiconductor device is used in a state of being applied with a voltage approximately ten times as high as that of a silicon device. As such, when the trench gate structure is adapted to the SiC semiconductor device, a gate insulation film formed in a trench is applied with an electric field an intensity of which is ten times as high as that of the silicon device. As a result, the gate insulation film is easily broken at corner portions of the trench.

To solve such an issue, a patent literature 1 has proposed a structure of forming a p type layer at a part lower than a bottom portion (bottom surface) of the trench of the trench gate structure by ion-implantation of a p type impurity. Since such a p type layer is formed, electric field concentration is alleviated at the bottom portion of the trench, and the breakage of the gate insulation film can be reduced.

In the structure described in the patent literature 1, however, the p type layer is widely formed in the entirety of the bottom portion of the trench. The p type layer becomes in a floating state. Therefore, switching characteristics are likely to deteriorate.

Therefore, a patent literature 2 has proposed to form a low concentration p type layer also at both of ends of a trench with respect to a longitudinal direction of the trench, in a structure of having the p type layer at a bottom portion of the trench and having a gate insulation film a thickness of which is increased at the bottom portion of the trench by increasing the depth of the trench. Specifically, the low concentration p type layer is formed by performing diagonal ion-implantation to both of the ends of the trench with respect to the longitudinal direction of the trench. In this case, a p type base region and the p type layer at the bottom portion of the trench are connected to each other through the low concentration p type layer at the ends of the trench to restrict the p type layer from being in the floating state. Therefore, the deterioration of the switching characteristics, when the switching element is turned on, can be reduced. Further, when the switching element is turned off, the low concentration p type layer at the ends of the trench is completely depleted, and the p type layer at the bottom portion of the trench is in the floating state. Therefore, an $n^-$ type drift layer can be divided into an upper portion and a lower portion. As such, a pseudo PNPN structure is made by the p type base region, the portions of the depletion layer divided up and down on the periphery of the p type layer of the drift layer, and the depletion layer, thereby to achieve high withstand voltage. In this way, the high withstand voltage, low on-state resistance, and high switching speed are achieved.

PRIOR ART LITERATURE

Patent Literature

Patent Literature 1: JP 10-98188 A
Patent Literature 2: JP 2007-242852 A

SUMMARY OF INVENTION

In the structure of the patent literature 2, the low concentration p type layer is formed by performing the diagonal ion-implantation to both of the ends of the trench with respect to the longitudinal direction of the trench. Therefore, it is possible to connect the p type base region and the p type layer at the bottom portion of the trench to each other so as to restrict the p type layer from being in the floating state. However, it is necessary to perform the diagonal ion-implantation separately. Therefore, a producing process is likely to be complex, for example, due to transferring the work to an ion-implantation apparatus, resulting in the increase in manufacturing costs. Further, a drain leakage current occurs due to a damage caused by a defect in the ion-implantation. In the case of ion-implantation, if the side surfaces of the trench are not perpendicular, the $n^-$ type drift layer is turned to the p type in the entirety of the side surfaces of the trench. As a result, the element does not operate as the FET. However, it is difficult to process the side surfaces of the trench perpendicularly.

The present disclosure is made in view of the foregoing issues, and it is a first object to provide a method for producing an SiC semiconductor device which can realize high withstand voltage and high switching speed, without depending on the ion-implantation. Also, it is a second object to provide an SiC semiconductor device that can more accurately realize the high withstand voltage and the high switching speed.

According to a first aspect of the present disclosure, a method for producing an SiC semiconductor device having a semiconductor switching element includes: a trench etching step of forming a trench by etching, the trench passing through a source region and a base region to reach a drift layer, and having a line shape defining a longitudinal direction in one direction; and a step of forming a second conductivity type layer including a rounded bottom layer located at a bottom portion of the trench and a rounded end layer located at an end of the trench with respect to the longitudinal direction. In the step of forming the second conductivity type layer, epitaxially growing is performed to form a second conductivity type silicon carbide layer in the trench, and then hydrogen etching is performed to leave the silicon carbide layer only at the bottom portion and the end of the trench.

In this way, the second conductivity type layer is formed by leaving the silicon carbide layer only at the bottom portion of the trench and the end of the trench with respect to the longitudinal direction by the hydrogen etching, after the silicon carbide layer is formed in the trench by the epitaxially growing. Namely, the portion of the silicon carbide layer formed on a side surface of the trench is removed. As described above, since the second conductivity type layer including the rounded bottom layer and the rounded end layer is formed by the epitaxially growing, the second conductivity type layer can be formed without depending on the diagonal ion-implantation. Therefore, since it is not necessary to separately perform the diagonal ion-implantation, it is less likely that the production process will be complicated due to the transferring to an ion-implantation apparatus or the like. Further, manufacturing costs reduce. Since there is no damage due to a defect caused by the ion-implantation, a drain leakage can be reduced. Also, it is possible to restrict the second conductivity type layer from being remained on the side surface of the trench. Accordingly, it is possible to produce the SiC semiconductor device that can achieve high withstand voltage and high switching speed, without depending on the ion implantation.

According to a second aspect of the present disclosure, in the step of forming the second conductivity type layer, the second conductivity type layer is formed by performing the hydrogen etching without reducing the temperature continuously in an epitaxial growth apparatus used when the silicon carbide layer is formed. In this way, since the hydrogen etching is also performed in the same epitaxial growth apparatus, the production process can be simplified.

According to a third aspect of the present disclosure, an SiC semiconductor device has a semiconductor switching element with an inversion type trench gate structure in which an inversion type channel region is formed in a surface portion of a base region located on a side surface of a trench by controlling an application voltage to a gate electrode to allow an electric current between a source electrode and a drain electrode through a source region and a drift layer. The SiC semiconductor device has a trench and a second conductivity type layer made of a second conductivity type silicon carbide. The trench is formed to extend from a surface of the source region to a position deeper than the base region. The trench has a shape defining a longitudinal direction in one direction and having an end in the longitudinal direction. The second conductivity type layer includes a rounded bottom layer formed at the bottom of the trench and a rounded end layer formed at the end of the trench with respect to the longitudinal direction of the trench. The rounded bottom layer and the rounded end portion are formed only at the bottom portion of the trench and the end of the trench with respect to the longitudinal direction by epitaxially growing.

As described above, the second conductivity type layer is made of the bottom layer located at the bottom portion of the trench and the end layers formed at both of the ends of the trench, so that the bottom layer is connected to the base region through the end layers. In the SiC semiconductor device having such a structure, when the semiconductor switching element is turned off, an electric field hardly enter due to a depletion layer extending from the bottom layer to the drift layer based on a built-in potential. Therefore, it is possible to achieve high withstand voltage. On the other hand, when the semiconductor switching element is switched from off to on, since the bottom layer is connected to the base region through the end layers and is not in a floating state, holes can be immediately supplied to the bottom layer through the end layers. Therefore, a low on-state resistance can be realized, and high switching speed can be achieved.

BRIEF DESCRIPTION OF DRAWINGS

The above and other objects, features and advantages of the present disclosure will become more apparent from the following detailed description made with reference to the accompanying drawings. In the drawings.

DESCRIPTION OF EMBODIMENTS

Hereinafter, embodiments of the present disclosure will be described with reference to the drawings. In the following description, parts identical with or equivalent to each other in the respective embodiments are designated with the same reference numbers.

First Embodiment

A first embodiment of the present disclosure will be described. In this case, an SiC semiconductor device formed with an n-channel inversion type MOSFET as a semiconductor switching element with a trench gate structure will be described as an example.

Figure 1:
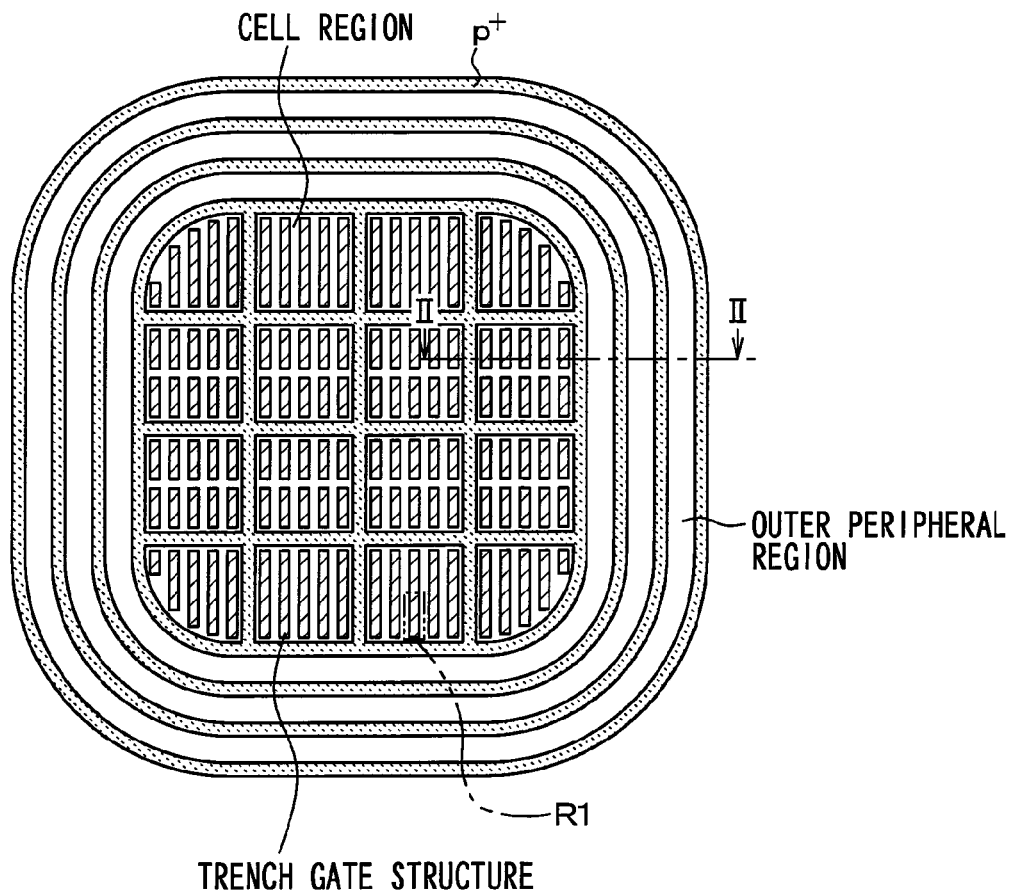
FIG. 1 is a diagram illustrating a layout of an upper surface of an SiC semiconductor device having a MOSFET with an inversion type trench gate structure according to a first embodiment of the present disclosure.

An SiC semiconductor device shown in FIG. 1 has a cell region formed with a semiconductor element and an outer peripheral region (terminated structure region) provided with an outer peripheral withstand voltage structure surrounding the cell region. In the present embodiment, the SiC semiconductor device has the MOSFET with an inversion type trench gate structure as the semiconductor element.

Figure 2:
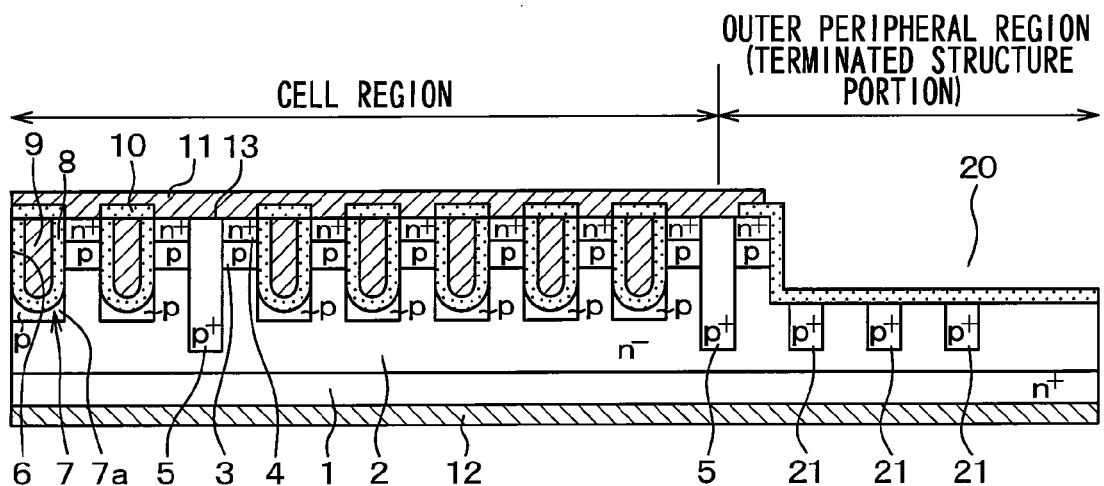
FIG. 2 is a diagram illustrating a cross-section of the SiC semiconductor device taken along a line II-II in FIG. 1.

As shown in FIG. 2, the SiC semiconductor device employs a semiconductor substrate in which an $n^-$ type drift layer 2, a p type base region 3, and an $n^+$ type source region 4, which are made of SiC, are epitaxially grown on a main surface of an $n^+$ type substrate 1 made of SiC.

The n+ type substrate 1 is, for example, $1.0\times10^{19}/cm^3$ in n type impurity concentration of such as nitrogen, and about 300 µm in thickness. The n− type drift layer 2 is, for example, 3.0 to $7.0\times10^{15}/cm^3$ in n type impurity concentration of such as nitrogen, and about 10 to 15 µm in thickness. The impurity concentration of the n− type drift layer 2 may be kept constant in a depth direction thereof, but it may be possible to have an inclined concentration distribution such that the concentration of the n− type drift layer 2 is higher on a side adjacent to the n+ type substrate 1 than a side far from the n+ type substrate 1. With the above configuration, because an internal resistance of the n− type drift layer 2 can be reduced, an on-resistance can be reduced.

The p type base region 3 is, for example, $5.0\times10^{16}$ to $2.0\times10^{19}/cm^3$ in p type impurity concentration of such as boron or aluminum, and approximately 2.0 µm in thickness. The n+ type source region 4 is, for example, $1.0\times10^{21}/cm^3$ in n type impurity concentration (surface concentration) of such as phosphorous in the surface layer portion, and approximately 0.5 µm in thickness.

In the cell region, the n+ type source region 4 remains on the surface of the p type base region 3 within the p type base region 3, and the p+ type deep layer 5 is formed to pass through the n+ type source region 4 and the p type base region 3 and to reach the n− type drift layer 2. The p+ type deep layer 5 is, for example, $1.0\times10^{19}/cm^3$ in p type impurity concentration (surface concentration) of such as boron or aluminum in the surface layer portion, approximately 0.5 µm in width, and approximately 2.7 µm in depth. The p+ type deep layer 5 is formed to a position deeper than the trench 6, which forms a trench gate structure described later, and a p type layer 7 formed at the bottom of the trench 6, so that body break preferentially occurs at the bottom portion of the p+ type deep layer 5. In the present embodiment, the p+ type deep layer 5 has a layout including a grid portion dividing the cell region into plurality of sections in the cell region and a rectangular portion with rounded corners surrounding an outer end of the cell region.

Figure 3:
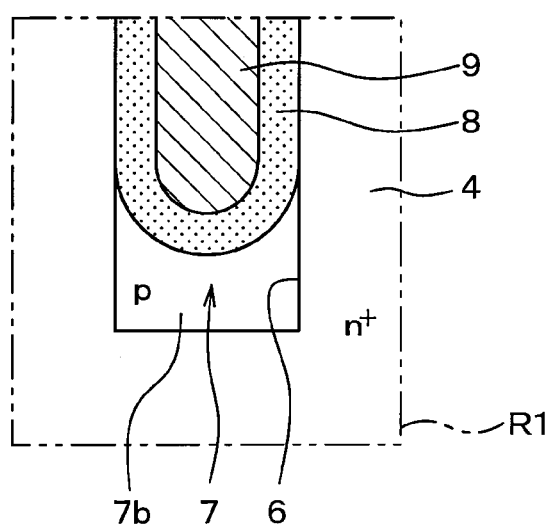
FIG. 3 is a diagram illustrating an enlarged view of the end of a trench gate structure corresponding to a region R1 in FIG. 1.

The trench 6 is formed to pass through the p type base region 3 and the n+ type source region 4 and to reach the n− type drift layer 2. The trench is, for example, 0.5 to 2.0 µm in width, and 2.0 µm or more (e.g., 2.4 µm) in depth. The p type base region 3 and the n+ type source region 4 are arranged to contact with the side surface of the trench 6. The trench 6 is formed to have a line-shaped layout that defines a width direction in a left and right direction in FIG. 1, a longitudinal direction in a direction perpendicular to a sheet of FIG. 1, and a depth direction in an up and down direction in FIG. 1. In FIG. 2 and FIG. 3, the bottom portion and corner portions of both of the ends of the trench 6 have edged shapes. However, the bottom portion and the corner portions of both the ends of the trench 6 may have rounded shapes.

A plurality of the trenches 6 is arranged in parallel to each other to have a stripe shape. A plural number of the trenches 6 are disposed in each area that is divided by the p+ type deep layer 5, and in that area, the trenches 6 are arranged at an equal interval. A distance between the trenches 6 is set to a dimension, such as 1 to 2 µm, so that an electric filed does not enter between the trenches 6 when the MOSFET is turned off. A distance between the trench 6, which is the closet to the p+ type deep layer 5 among the trenches 6, and the p+ type deep layer 5, and a distance between the respective ends of the trench 6 and the p+ type deep layer 5 are set to a distance a or less. The distance a is determined based on a width of a depletion layer extending from a later-described p type SiC layer 7 toward the n− type drift layer 2 based on a built-in potential when the MOSFET is turned off, and is at least two times the width of the depletion layer and at most three times the width of the depletion layer.

Further, as shown in FIG. 2 and FIG. 3, the p type SiC layer 7 is formed within the trench 6. The p type SiC layer 7 is formed at a relatively high concentration, such as $3\times10^{17}$ to $3\times10^{18}/cm^3$ in p type impurity concentration, and is approximately 0.2 µm in thickness. Specifically, the p type SiC layer 7 is also formed at the bottom portion of the trench 6 and both of the ends with respect to the longitudinal direction. Hereinafter, a portion of the p type SiC layer 7 formed at the bottom portion of the trench 6 and having a rounded surface is referred to as a bottom p type layer 7a, and portions of the p type SiC layer 7 formed at both of the ends of the trench 6 and having rounded surfaces are referred to as end p type layers 7b. The bottom p type layer 7a corresponds to a rounded bottom layer, and the end p type layers 7b correspond to rounded end layers.

The bottom p type layer 7a is formed on the bottom surface of the trench 6 by epitaxially growing. A shallowest position of the bottom p type layer 7a is deeper than the bottom portion of the p type base region 3. A deepest position of the bottom p type layer 7a is shallower than the bottom portion of the p+ type deep layer 5. Therefore, the n− type drift layer 2 remains between the p type base region 3 and the bottom p type layer 6a to allow formation of a channel, and the body break can preferentially occur at the bottom portion of the p+ type deep layer 5. An upper surface of the bottom p type layer 7a is a curved surface being rounded, and is smoothly joined to both of the side surfaces of the trench 6 without having steps.

The end p type layers 7b are formed on both of end surfaces of the trench 6 by epitaxially growing. Inner surfaces of the end p type layers 7b are also curved surfaces being rounded, and are smoothly joined to both of the side surfaces of the trench 6 substantially without having steps.

The p type SiC layer 7 is made of the bottom p type layer 7a and the end p type layers 7b. Therefore, although the bottom p type layer 7a is arranged separate from the p type base region 3, the end p type layers 7b are connected to the p type base region 3. As such, the p type SiC layer 7 is fixed to the same potential as the p type base region 3, and is not made in the floating state. It is to be noted that the p type SiC layer 7 is not formed on both of the side surfaces of the trench 6. Therefore, the n− type drift layer 2, the p type base region 3, and the n+ type source region 4 are exposed on both of the side surfaces of the trench 6.

The inner wall surface of the trench 6 is covered with a gate insulation film 8. A gate electrode 9 made of doped polysilicon is formed on the surface of the gate insulation film 8 to fully fill the inside of the trench 6. The gate insulation film 8 is made of a thermal oxide film formed by thermally oxidizing the inner wall surface of the trench 6, for example. The thickness of the gate insulation film 8 is approximately 100 nm on the side surfaces and the bottom portion of the trench 6. Further, as described above, since the upper surface of the bottom p type layer 7a and the inner surfaces of the end p type layers 7b of the p type SiC layer 7 in the trench 6 are the curved surface being rounded, the bottom surface of the gate insulation film 8 also has a rounded shape. Therefore, the gate insulation film 8 is made to entirely have an equal thickness, and the thickness of the gate insulation film 8 is not reduced at a corner portion of the trench 6. As described above, the trench gate structure is provided.

A source electrode 11 and a gate wiring (not shown) are formed on the n+ type source region 4, the surface of the p+ type deep layer 5, and the surface of the gate electrode 9 through an interlayer insulation film 10. The source electrode 11 and the gate wiring are made of plural metals (for example, Ni and Al), in such a manner that at least a portion contacting with the n type SiC (in particular, the n+ type source region 4) is made of a metal that can make an ohmic contact with the n type SiC, and at least a portion contacting with the p type SiC (in particular, the p+ type deep layer 5) is made of a metal that can make an ohmic contact with the p type SiC. The source electrode 11 and the gate wiring are electrically insulated as being formed on the interlayer insulation film 10. Via contact holes 13 formed in the interlayer insulation film 10, the source electrode 11 is electrically in contact with the p type base region 3 through the n+ type source region 4 and the p+ type deep layer 5, and the gate wiring is electrically in contact with the gate electrode 9.

A drain electrode 12 is formed on the rear side of the n+ type substrate 1 to be electrically connected to the n+ type substrate 1. By such a structure, the MOSFET with the n-channel inversion type trench gate structure is formed. The cell region is provided in such a manner that these MOSFETs are separately arranged in respective sections divided by the p+ type deep layer 5.

In the outer peripheral region, on the other hand, the p type base region 3 is formed in the upper portion of the n− type drift layer 2, similarly to the cell region. However, a recessed portion 20 is formed to extend through the p type base region and to reach the n− type drift layer 2. Thus, the outer peripheral region has a mesa-structure. For this reason, the n+ type source region 4 and the p type base region 3 are removed and the n− type drift layer 2 is exposed at a position away from the cell region.

In a surface layer portion of the n− type drift layer 2 located under the recessed portion 20, a plurality of p+ type guard ring layers 21 (three layers 21 are illustrated in FIG. 1) is provided to surround the cell region. The p+ type guard ring layers 21 have a concentration and a depth so that the p+ type guard ring layers 21 can serve as a guard ring. In the present embodiment, the p+ type guard ring layers 21 have the p type impurity concentration of such as boron or aluminum same as that of the p+ type deep layer 5, and the bottom portion of the p+ type guard ring layers 21 is at the same height as that of the p+ type deep layer 5. Although not illustrated, an EQR structure may be formed on an outer periphery of the p+ type guard ring layers 21, as necessary, so that the outer peripheral region having an outer peripheral withstand voltage structure and surrounding the cell region is formed.

The SiC semiconductor device according to the present embodiment has the structure described above. Next, the method for producing the SiC semiconductor device according to the present embodiment will be described with reference to FIGS. 4 to 6.

Figure 4:
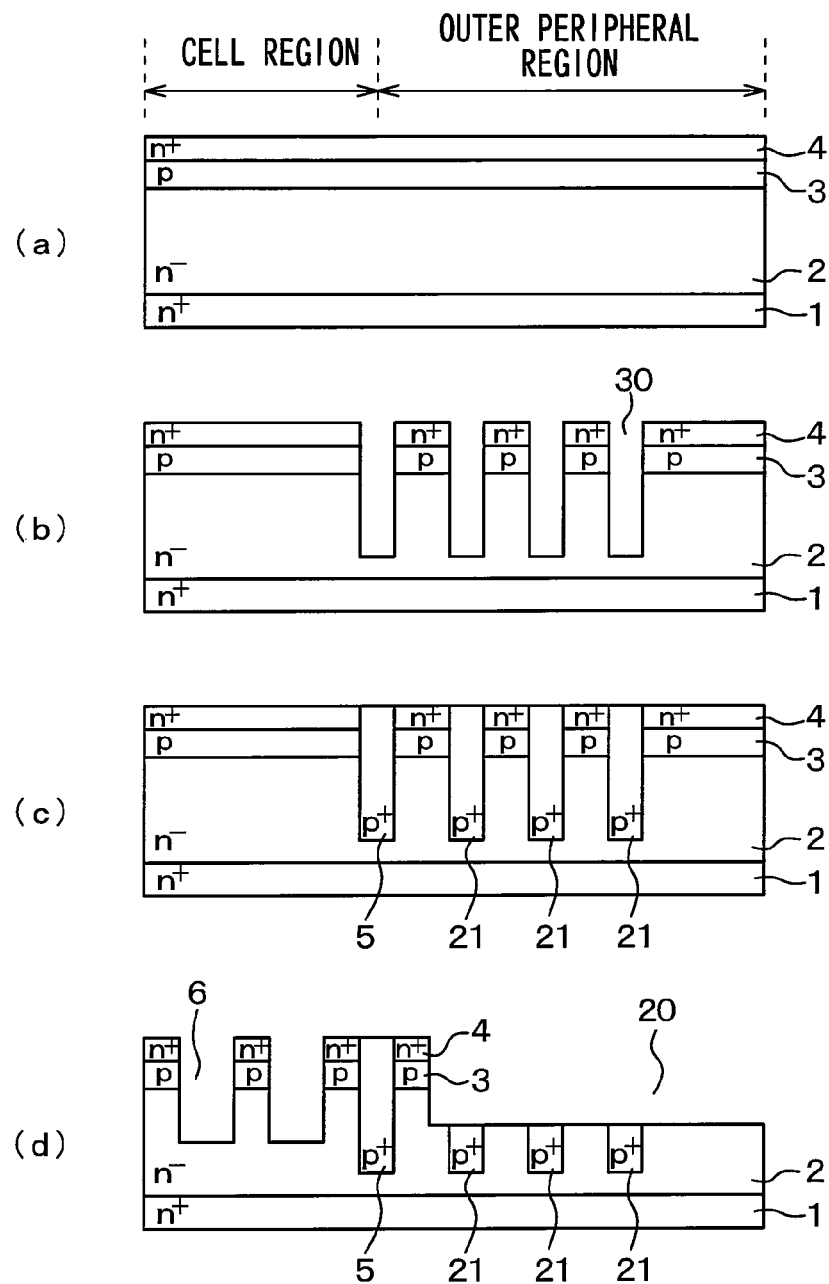
FIG. 4 (a) to (d) are diagrams illustrating a cross-section for showing a production process of the SiC semiconductor device shown in FIG. 1.

[Step Shown in (a) of FIG. 4]

Firstly, as the semiconductor substrate, a triple epitaxial substrate in which the n− type drift layer 2, the p type base region 3, and the n+ type source region 4, which are made of SiC, are orderly epitaxially grown on the main surface of the n+ type substrate 1 made of SiC is prepared.

[Step Shown in (b) of FIG. 4]

A mask material (not shown) is placed on the surface of the n+ type source region 4, and then openings are formed in the mask material by photolithography at locations corresponding to positions where the p+ type deep layer 5 and the p+ type guard ring layers 21 are to be formed. In the state where the mask material is still placed thereon, anisotropic etching, such as RIE (Reactive Ion Etching), is performed to form the trenches 30 at the positions where the p+ type deep layer 5 and the p+ type guard ring layers 21 are to be formed. Thereafter, the mask material is removed.

[Step Shown in (c) of FIG. 4]

A p+ type layer is epitaxially grown on the entire surface of the n+ type source region 4 including the inside of the trenches 30. Specifically, the inside of the trenches 30 is filled with the p+ type layer. Further, the surface of the n+ type source region 4 is exposed by flattening, such as by grinding or CMP (Chemical Mechanical Polishing). As a result, the p+ type layer remains only within the trenches 30, and thus the p+ type deep layer 5 and the p+ type guard ring layers 21 are provided by the p+ type layer.

[Step Shown in (d) of FIG. 4]

A mask material (not shown) is placed on the surfaces of the n+ type source region 4, the p+ type deep layer 5 and the p+ type guard ring layers 21, and then openings are formed in the mask material by photolithography at locations corresponding to positions where the trenches 6 and the recessed portion 20 are to be formed. Then, in the state where the mask material is still placed thereon, anisotropic etching, such as RIE, is performed to form the trenches 6 in the cell region and the recessed portion 20 in the outer peripheral region. Thereafter, the mask material is removed.

Figure 5:
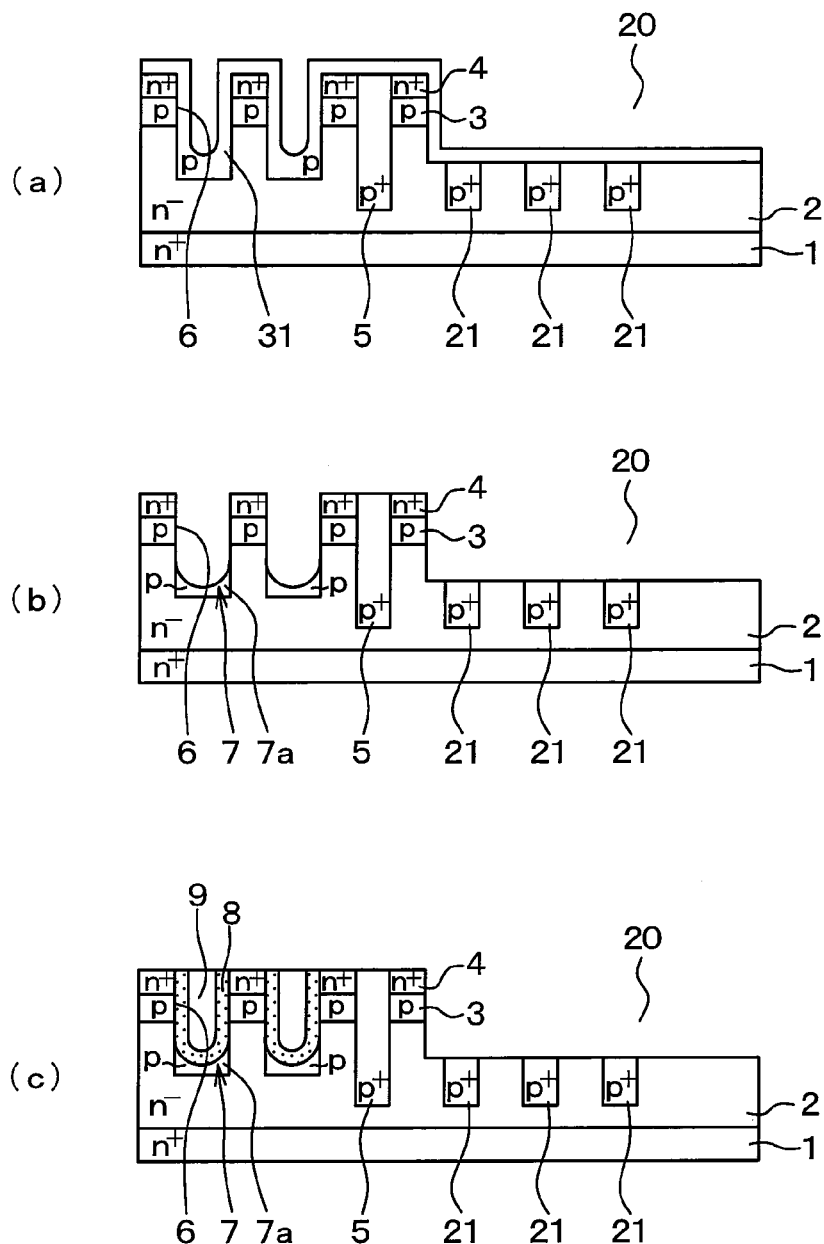
FIG. 5 (a) to (c) are diagrams illustrating a cross-section for showing the production process of the SiC semiconductor device subsequent to (a) to (d) of FIG. 4.
Figure 6:
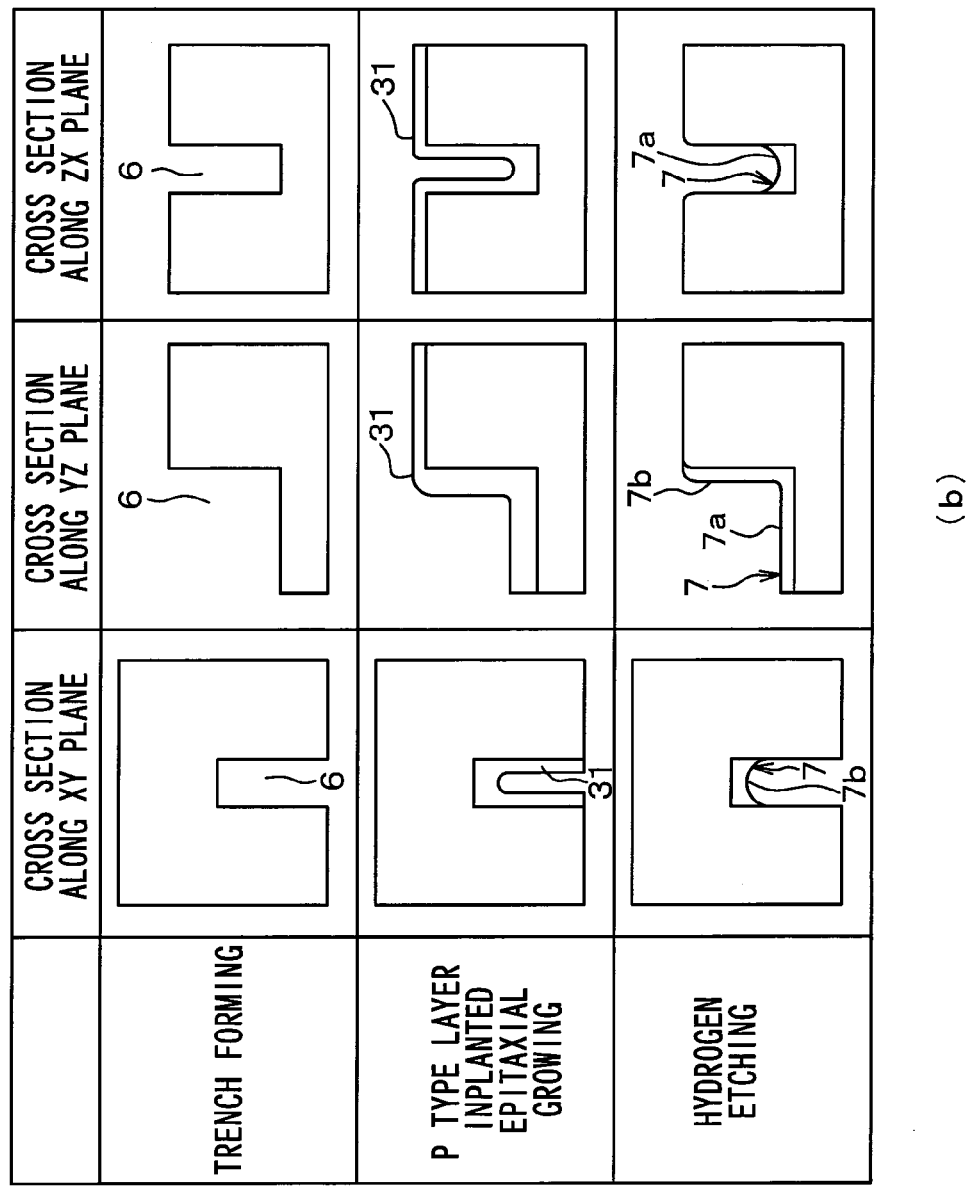
FIG. 6 is a diagram illustrating an aspect of each step of (d) of FIG. 4, (a) and (b) of FIG. 5, and in which (a) is an image diagram of a perspective sectional view of a trench 6, and (b) is a diagram illustrating cross-sections of the view of (a) along an XY plane, a YZ plane and a ZX plane of each step.
Figure 6:
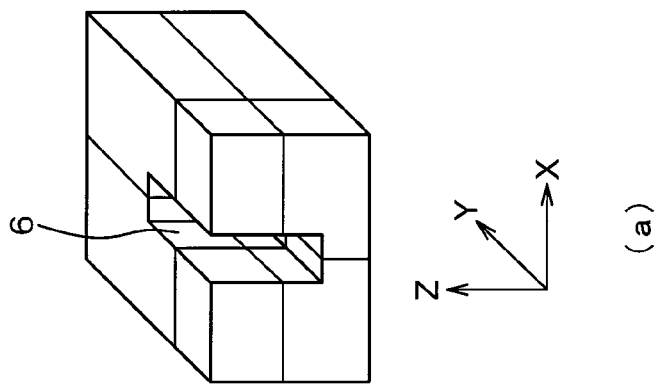

An aspect of each of the steps shown in (d) of FIGS. 4 and (a) and (b) of FIG. 5 is illustrated in FIG. 6. In FIG. 6, (a) illustrates an image of a perspective sectional view of the trench 6, and (b) illustrates cross-sections of the trench 6 at an XY plane, YZ plane and ZX plane of the respective steps. Therefore, when the steps are performed, the bottom portion of the trench 6 and the corner portions of both of the ends of the trench 6 are in the edged state.

[Step Shown in (a) of FIG. 5]

Using an epitaxial growing apparatus, a p type layer (SiC layer) 31 is epitaxially grown, including the inside of the trenches 6. For example, the p type layer 31 is formed with a relatively high concentration in which the p type impurity concentration is, for example, $3 \times 10^{17}$ to $3 \times 10^{18}$/cm$^3$. In this case, as shown in (b) of FIG. 6, the p type layer 31 is formed such that the thickness of the p type layer 31 is greater on the bottom portion and the end portions of the trench 6 than on the side surfaces of the trench 6 and the n+ type source region 4.

[Step Shown in (b) of FIG. 5]

In the epitaxial growing apparatus used to form the p type layer 31, hydrogen etching is continuously performed without decreasing the temperature to isotropically etch the p type layer 31 and to remove damage due to the trench etching. In this way, since the hydrogen etching is also performed continuously in the same epitaxial growing apparatus, the production process can be simplified. For example, the hydrogen etching is performed in a hydrogen atmosphere under decompression at 1600 degrees Celsius or higher, such as under a high-temperature hydrogen atmosphere of, for example, 1625° C. and $2.7 \times 10^4$ Pa (200 Torr). By this hydrogen etching, the damage due to the trench etching is removed. Also, the portions of the p type layer 31 formed on the side surfaces of the trench 6 and on the surface of the n+ type source region 4 are fully removed, and thus the base is exposed. Further, the portions of the p type layer 31 formed on the bottom portion and at the end portion of the trench 6 remain. In this way, as shown in (b) of FIG. 6, the bottom p type layer 7a is provided by the portion of the p type layer 31 formed on the surface of the bottom portion of the trench 6, and the end p type layer 7b is provided by the portions of the p type layer 31 formed on the surfaces of both the ends of the trench 6. The p type SiC layer 7 is provided by the bottom p type layer 7a and the end p type layer 7b.

[Step Shown in (c) of FIG. 5]

The gate insulation film 8 is formed by thermal oxidation in a wet atmosphere, and then a doped poly-silicon layer is formed on the surface of the gate insulation film 8. The doped poly-silicon layer is patterned to leave within the trench 6, thereby forming the gate electrode 9. Subsequently, similarly to conventional steps, a step of forming the interlayer insulation film 10, a step of forming contact holes by a photolithography etching, a step of forming the source electrode 11 and the gate wiring layer by depositing an electrode material and then patterning the electrode material, a step of forming the drain electrode 12 on the rear surface of the n+ type substrate 1, and the like are performed. As a result, the SiC semiconductor device including the cell region having the MOSFETs with the trench gate structure and the outer peripheral region having the p+ type deep layer 5 surrounding the cell region and the p+ type guard ring layers 21, as shown in FIG. 2, is produced.

As described above, in the present embodiment, the p type SiC layer 7 is provided by the bottom p type layer 7a located at the bottom of the trench 6 and the end p type layers 7b formed at both of the ends of the trench 6. The bottom p type layer 7a is connected to the p type base region 3 through the end p type layers 7b.

In the SiC semiconductor device having such a structure, when the MOSFET is turned off, the electric field hardly enters due to the depletion layer extending from the bottom p type layer 7a to the n− type drift layer 2 based on the built-in potential. Therefore, it is possible to achieve high withstand voltage.

On the other hand, when the MOSFET is switched from off to on, since the bottom p type layer 7a is connected to the p type base region 3 through the end p type layers 7b and is not in the floating state, holes are immediately supplied to the bottom p type layer 7a through the end p type layers 7b. Therefore, it is possible to achieve high switching speed.

The distance between the p+ type deep layer 5 and the closest trench 6, which is the closest to the p+ type deep layer 5 among the trenches 6, and the distance between the ends of the trench 6 and the p+ type deep layer 5 are set to the distance a or less. The distance a is twice or more and three times or less of the width of the depletion layer that extends from the p type SiC layer 7 toward the n− type drift layer 2, when the MOSFET is turned off. Since the distance a is twice or more of the width of the depletion layer, it is less likely that the on-state resistance will increase due to the current path being excessively reduced at the time of turning on. Since the distance a is three time or less of the width of the depletion layer, it is possible to restrict the electric field, at the time of turning off, from entering between each trench gate structure and the p+ type deep layer 5, and thus the breakage of the gate insulation film 8 is reduced.

Further, since the p type SiC layer 7 is provided on the bottom surface of the trench 6 to restrict the entry of the electric field, it is not necessary to arrange the p+ type deep layer 5 in every space between adjacent trenches 6. Therefore, it is possible to increase an occupancy ratio of the trench gate structure in the cell region, that is, a cell effective area, and thus the on-state resistance can be further reduced. Since the p+ type deep layer 5 is separated from the trench 6, it is possible to restrict a breakdown current, at the time of body break, from restricting in the vicinity of the gate insulation film 8. Therefore, the reliability of the gate insulation film 8 can be ensured.

In the SiC semiconductor device having such a structure, the p type SiC layer 7 is formed by forming the p type layer 31 in the trench 6 by the epitaxial growing and then by leaving the p type layer 31 only at the bottom portion and both of the end portions of the trench 6 by the hydrogen etching. That is, the portion of the p type layer 31 formed on the side surface of the trench 6 is removed. In this way, since the p type SiC layer 7 including the bottom p type layer 7a and the end p type layers 7b can be formed by the epitaxially growing, the p type SiC layer 7 can be formed without depending on diagonal ion-implantation. In addition, as the effect of the hydrogen etching, the damage caused when the trench is formed is removed, and unevenness of the surface of the trench is reduced. As such, the channel mobility and the life of the gate insulation film improve. Further, since it is not necessary to separately perform the diagonal ion implantation, it is less likely that the production process will be complex due to the moving the device to the ion implantation apparatus or the like. Further, the manufacturing costs can be reduced. Moreover, since there is no damage due to the fault caused by the ion implantation, the drain leakage is reduced. Furthermore, it is possible to restrict the p type SiC layer 7 from remaining on the side surfaces of the trench 6.

In the present embodiment, the p+ type deep layer 5 and the p+ type guard ring layers 21 are the embedded epitaxial type that is formed as being embedded in the trench 30 by the epitaxial growing. Alternatively, the p+ type deep layer 5 and the p+ type guard ring layers 21 may be formed by ion implantation.

Second Embodiment

A second embodiment of the present disclosure will be described. In the present embodiment, the structure of the p+ type deep layer 5 is modified from that of the first embodiment. The others are similar to the first embodiment, and thus only the part different from the first embodiment will be described.

Figure 7:
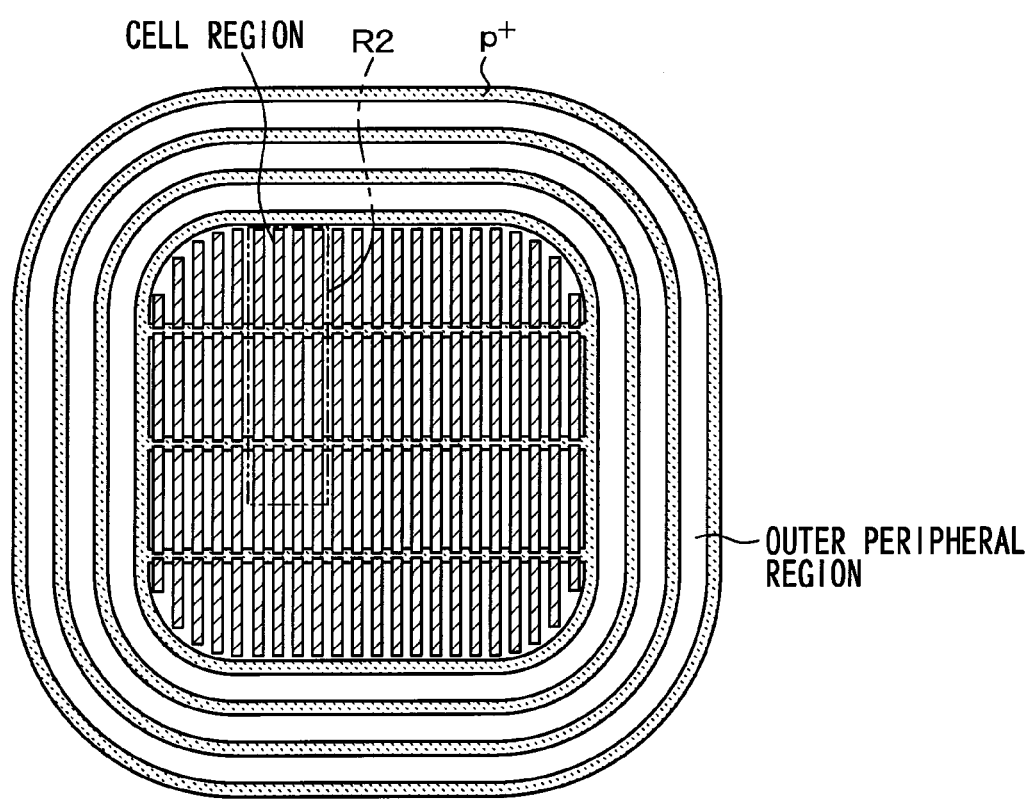
FIG. 7 is a diagram illustrating a layout of an upper surface of an SiC semiconductor device having a MOSFET with an inversion type trench gate structure according to a second embodiment of the present disclosure.

The SiC semiconductor device shown in FIG. 7 also includes the cell region in which a semiconductor element is formed and the outer peripheral region. However, the layout of the p+ type deep layer 5 formed in the cell region is different from that of the first embodiment. Specifically, as shown in the enlarged view of FIG. 8, the trench gate structure is divided into plural sections in the longitudinal direction, and the p+ type deep layer 5 is arranged to overlap the end portion of each of the divided trench gate structures. The p+ type deep layer 5 is formed into a line shape to continuously intersect with the divided trench gate structures that are arranged in parallel. Also, the p+ type deep layer 5 is arranged to enter to the lower position of each trench 6, as shown in FIG. 9.

Figure 8:
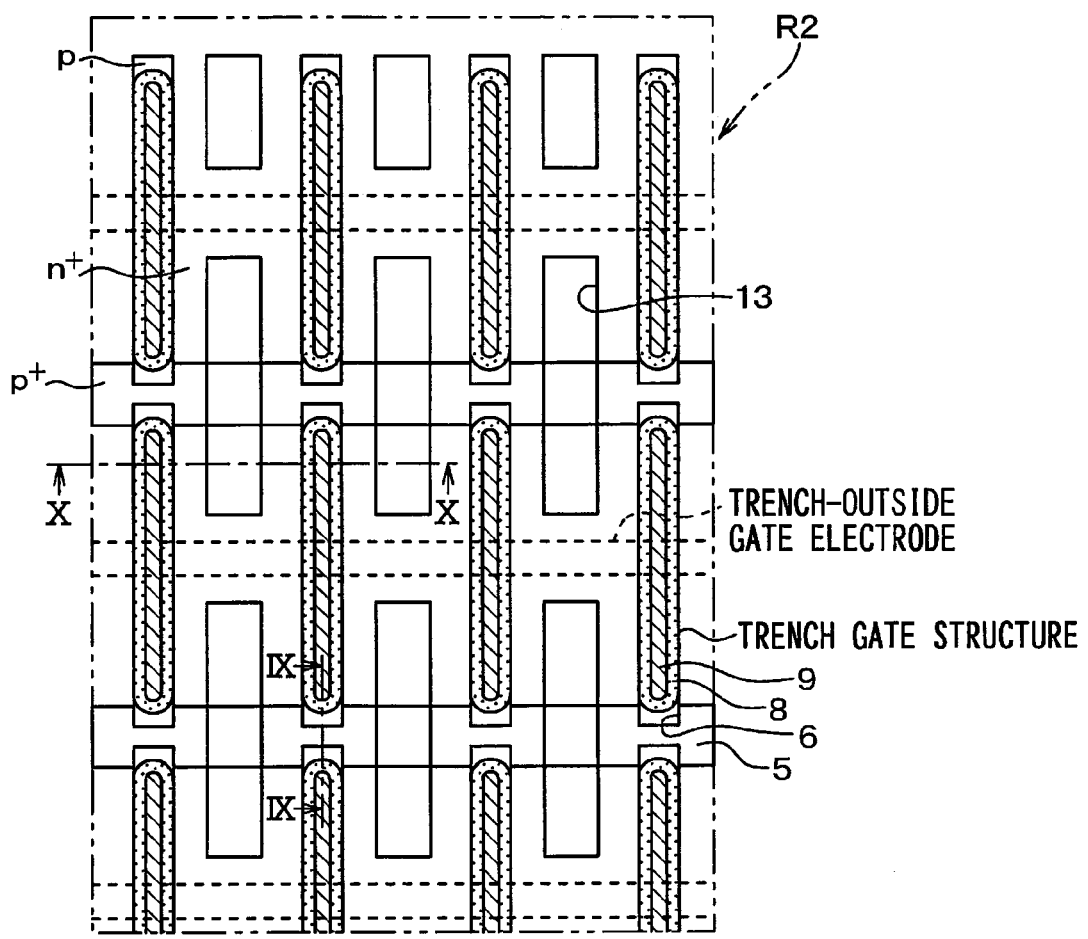
FIG. 8 is a diagram illustrating an enlarged view of the end of a trench gate structure corresponding to a region R2 in FIG. 7.
Figure 9:
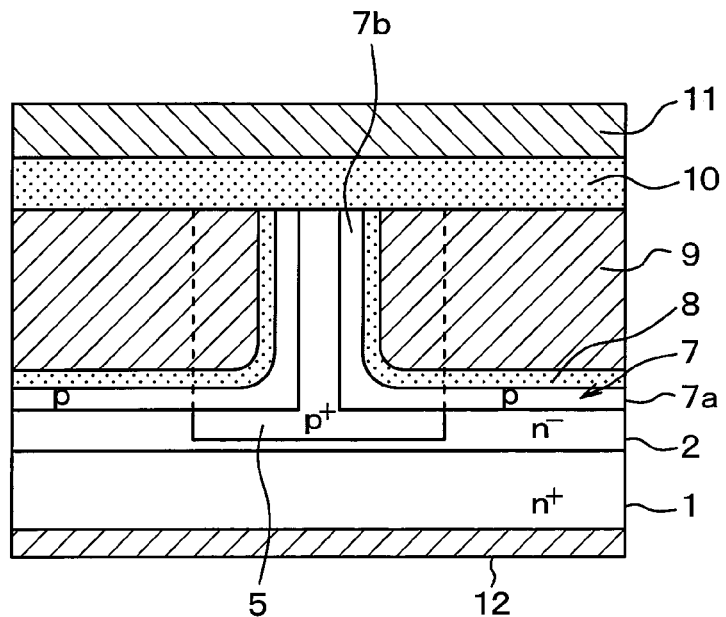
FIG. 9 is a diagram illustrating a cross-section of the SiC semiconductor device taken along a line IX-IX in FIG. 8.
Figure 10:
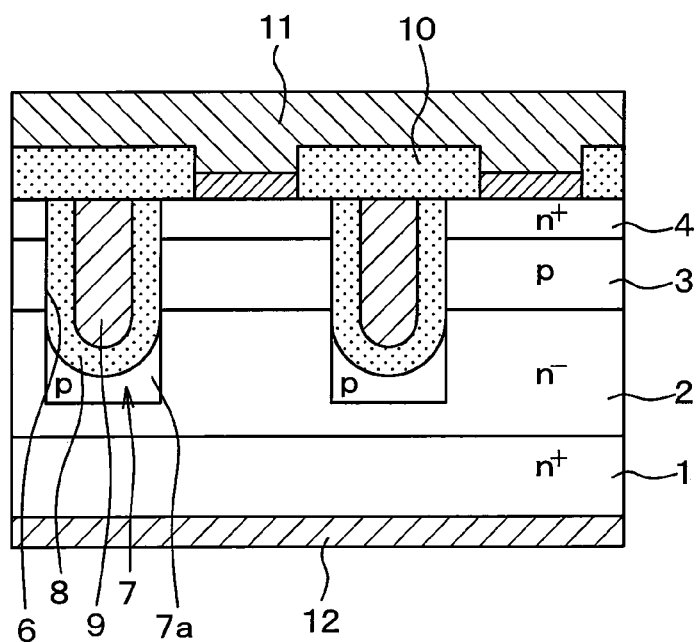
FIG. 10 is a diagram illustrating a cross-section of the SiC semiconductor device taken along a line X-X in FIG. 8.

A trench-outside gate structure that connects the gate electrodes 9 is arranged to intersect the middle portion of each of the divided trench gate structures, as shown by a dashed line in FIG. 8. As shown in FIG. 10, similar to the first embodiment, the electric connection between the n+ type source region 4 and the source electrode 11 is implemented through the contact holes 13 formed in the interlayer insulation film 10 at the position between the trench gate structures. The contact hole 13 is extended to a position corresponding to a location at which the trench gate structure is divided, not only formed at the position corresponding to the trench gate structure, and the electric connection between the p+ type deep layer 5 and the source electrode 11 is implemented through this portion of the contact hole 13.

In this way, the p+ type deep layer 5 may be provided only at the ends of the trench gate. In this structure, the area of the p+ type deep layer 5 can be limited. Therefore, it is possible to increase the occupancy ratio of the trench gate structure in the cell region, that is, the cell effective area, and hence the on-state resistance can be further reduced. The p+ type deep layer 5 can be separated from the region where the channel is formed in the trench gate structure. Therefore, it is possible to restrict the breakdown current at the time of body break from flowing in the vicinity of a region where the channel is formed in the gate insulation film 8. Therefore, deterioration of the gate insulation film 8 due to hot carriers can be reduced, and thus it is possible to improve the reliability of the gate insulation film 8.

The SiC semiconductor device having such a structure can be produced by the same production method as the SiC semiconductor device of the first embodiment, although the layout of the upper surface is different, and the p type SiC layer 7 can be formed by the epitaxial growing and the hydrogen etching. Therefore, it is not necessary to form the p type SiC layer 7 by the diagonal ion-implantation, and thus the effects similar to the first embodiment can be achieved.

Third Embodiment

A third embodiment of the present disclosure will be described. In the present embodiment, the p$^+$ type deep layer 5 is eliminated from the structure of the first embodiment, and the structure of the trench gate structure is modified from that of the first embodiment. The others are similar to those of the first embodiment. Therefore, only the parts different from the first embodiment will be described.

Figure 11:
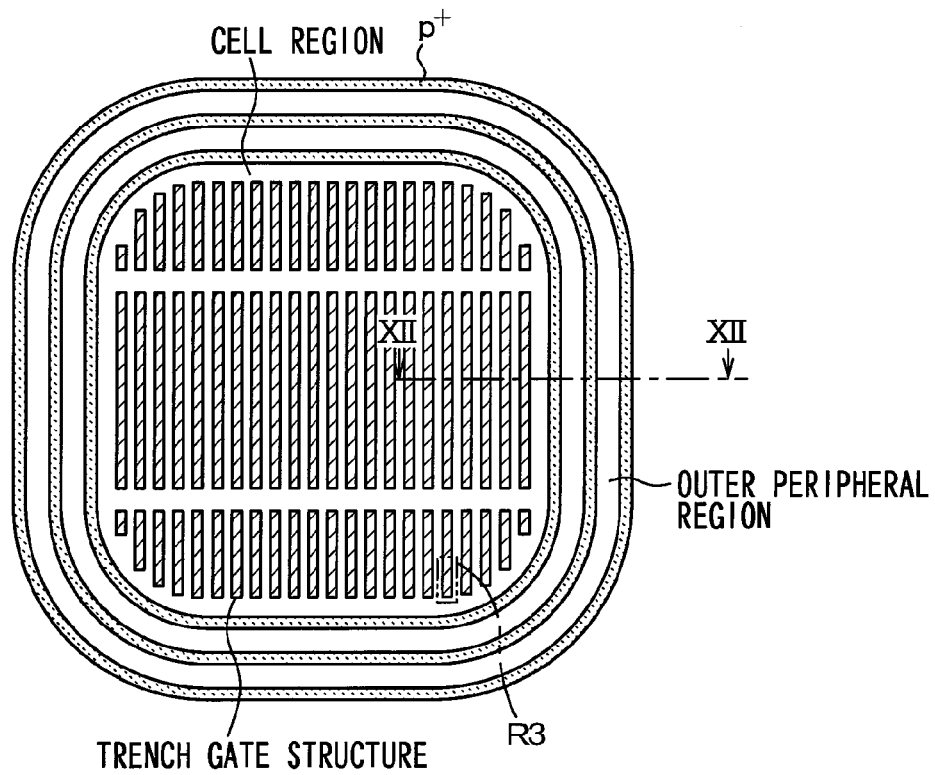
FIG. 11 is a diagram illustrating a layout of an upper surface of an SiC semiconductor device having a MOSFET with an inversion type trench gate structure according to a third embodiment of the present disclosure.
Figure 12:
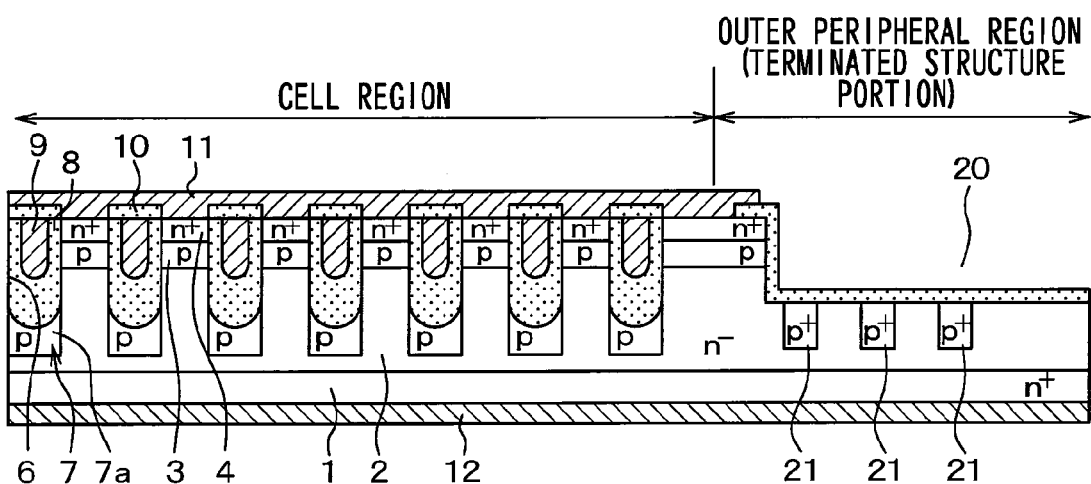
FIG. 12 is a diagram illustrating a cross-section of the SiC semiconductor device taken along a line XII-XII in FIG. 11.

The SiC semiconductor device shown in FIG. 11 also includes the cell region in which the semiconductor element is formed and the outer peripheral region. However, the p$^+$ type deep layer 5 is not formed in the cell region. In the trench gate structure of the present embodiment, as shown in FIG. 12, the depth of the trench 6 is increased, and, at the bottom portion and the end portions of the trench 6, the p type SiC layer 7 (the bottom p type layer 7a and the end p type layers 7) is formed and the thickness of the gate insulation film 8 is increased. The upper surface of a region R3 shown in FIG. 12 has the same layout as that of the region shown in FIG. 3.

Also in such an SiC semiconductor device, the p type base region 3 and the bottom p type layer 7a are connected to each other through the end p type layer 7b, and thus it is possible to restrict the p type SiC layer 7 from being in the floating state. Therefore, the deterioration of switching characteristics can be reduced. In this case, similar to the patent literature 2, it is necessary to make the concentration of the p type layer 7b lower than the p type layer 7a. When (0001) Si-face is used as the main surface, it is easily realized. This is because the efficiency of incorporating the p type impurity on the (1-100) m-face and the (11-20) a-face perpendicular to the (0001) Si-face are lower than that of the (0001) Si-face. As such, a pseudo PNPN structure is formed by the portions of the p type base region and the n$^-$ type drift layer 2 divided up and down by the depletion layer on the periphery of the bottom p type layer 7a and the depletion layer, and thus the high withstand voltage is achieved. Accordingly, the high withstand voltage, the low on-state resistance, and the high switching speed can be achieved.

The production method of the SiC semiconductor device having the above-described structure is typically same as that of the first embodiment, except that the p$^+$ type deep layer 5 is not formed when the p$^+$ type guard ring layer 21 is formed and the step of forming the gate insulation film 8 is changed. As the step of forming the gate insulation film 8, for example, the following step may be employed: the p type SiC layer 7 is formed on the bottom portion and both of the ends of the trench 6 by the epitaxially growing and the hydrogen etching; an insulation film is then deposited by the CVD technique; the insulation film is left at the bottom portion of the trench 6 by etch-back; and then thermal oxidation is further performed. In this way, also in the SiC semiconductor device of the present embodiment, it is not necessary to form the p type SiC layer 7 by the diagonal ion implantation. Therefore, the similar effects to the first embodiment can be achieved.

Other Embodiments

In each of the embodiments described above, an example to which the present disclosure is applied is described. However, design changes can be suitably applied. For example, in each of the embodiments described above, the oxide film made by thermal oxidation is employed as the example of the gate insulation film 8. Alternatively, the gate insulation film 8 may be provided by an oxide film that is made by a method other than the thermal oxidation or a nitride film. The step of forming the drain electrode 12 may be performed before the forming of the source electrode 11.

It is not always necessary to use the triple epitaxial substrate as the semiconductor substrate. For example, it may be used a semiconductor substrate in which the n$^-$ type drift layer 2 is epitaxially grown on the n$^+$ type substrate 1, the p type base region 3 is formed by ion implantation of a p type impurity on a surface layer portion of the n$^-$ type drift layer 2, and the n$^+$ type source region 4 is formed in the surface layer portion of the p type base region 3 by ion implantation to an n type impurity.

In each of the embodiments described above, the n channel type MOSFET in which a first conductivity type is the n type and a second conductivity type is a p type is exemplarily described. The present disclosure can be applied to a p channel type MOSFET in which the conductivity type of each element is reversed. In the above description, the MOSFET with the trench gate structure is exemplarily described. Alternatively, the present disclosure may be applied to an IGBT with a similar trench gate structure. In the IGBT, the conductivity type of the substrate 1 is only changed from the n type to the p type in each of the embodiments described above. The other structures and production methods are similar to those of each of the embodiments described above.

In each of the embodiments described above, the end p type layers 7b having the rounded shape are formed at both of the ends of the trench 6 with respect to the longitudinal direction. Alternatively, the end p type layer 7b may be formed at least at one of the ends so that the gate insulation film 8 is formed with the equal thickness at the end. Also in this case, the above-described effect can be achieved.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A silicon carbide semiconductor device comprising:
   a first or second conductivity type substrate made of silicon carbide;
   a first conductivity type drift layer made of silicon carbide, the first conductivity type drift layer being disposed on the first or second conductivity type substrate and having an impurity concentration lower than that of the first or second conductivity type substrate;
   a second conductivity type base region made of silicon carbide, the second conductivity type base region being disposed on the first conductivity type drift layer;

a first conductivity type source region made of silicon carbide, the first conductivity type source region being disposed in an upper layer portion of the second conductivity type base region and having an impurity concentration higher than that of the first conductivity type drift layer;

a trench extending from a surface of the first conductivity type source region to a position deeper than the second conductivity type base region, the trench having a shape that defines a longitudinal direction in one direction and has an end;

a second conductivity type layer made of second conductivity type silicon carbide, the second conductivity type layer being disposed only at a bottom portion of the trench and the end of the trench with respect to the longitudinal direction by epitaxially growing, the second conductivity type layer including a rounded bottom layer disposed at the bottom portion of the trench and a rounded end layer disposed at the end of the trench;

a gate insulation film disposed on the second conductivity type layer, on an inner wall surface of the trench;

a gate electrode disposed on the gate insulation film, in the trench;

a source electrode electrically connected to the first conductivity type source region and the second conductivity type base region; and a drain electrode disposed on a rear side of the first or second conductivity type substrate, wherein the silicon carbide semiconductor device is provided with a semiconductor switching element with an inversion type trench gate structure in which an inversion type channel region is formed on a surface portion of the second conductivity type base region located on a side surface of the trench by controlling an application voltage to the gate electrode to allow an electric current between the source electrode and the drain electrode through the first conductivity type source region and the first conductivity type drift layer.

2. The silicon carbide semiconductor device according to claim 1, further comprising a second conductivity type deep layer electrically connected to the source electrode, the second conductivity type deep layer being arranged spaced from the trench and being deeper than the trench, wherein a distance from one of the side surface and the end of the trench to the second conductivity type deep layer is equal to or less than three times a width of a depletion layer that extends from the rounded bottom layer of the second conductivity type layer toward the first conductivity type drift layer based on a built-in potential when the semiconductor switching element is turned off.

3. The silicon carbide semiconductor device according to claim 2, wherein the distance is equal to or greater than twice the width of the depletion layer.

4. The silicon carbide semiconductor device according to claim 2, wherein a plurality of the trenches is arranged in parallel to have a plane layout in which a plural number of the plurality of trenches is surrounded by the second conductivity type deep layer.

5. The silicon carbide semiconductor device according to claim 1, wherein the trench is divided into a plurality of sections in the longitudinal direction, and the second conductivity type layer is disposed to overlap an end of each of the sections of the trench.

6. The silicon carbide semiconductor device according to claim 1, wherein a main surface of the first or second conductivity type silicon carbide substrate is a (0001) Si-face, a thickness of the gate insulation film is greater at the bottom of the trench than on the side surface of the trench, and when the semiconductor switching element is turned off, the rounded end layer is fully depleted, thereby to divide the drift layer up and down.

* * * * *